US008620980B1

(12) United States Patent
Mauer et al.

(10) Patent No.: US 8,620,980 B1
(45) Date of Patent: *Dec. 31, 2013

(54) PROGRAMMABLE DEVICE WITH SPECIALIZED MULTIPLIER BLOCKS

(75) Inventors: Volker Mauer, Lacey Green (GB); Martin Langhammer, Alderbury (GB)

(73) Assignee: Altera Corporation, San Jose, CA (US)

(*) Notice: Subject to any disclaimer, the term of this patent is extended or adjusted under 35 U.S.C. 154(b) by 878 days.

This patent is subject to a terminal disclaimer.

(21) Appl. No.: 12/693,614

(22) Filed: Jan. 26, 2010

Related U.S. Application Data

(63) Continuation-in-part of application No. 12/547,664, filed on Aug. 26, 2009, now abandoned, which is a continuation of application No. 11/238,040, filed on Sep. 27, 2005, now Pat. No. 7,590,676.

(51) Int. Cl.
*G06F 17/10* (2006.01)
(52) U.S. Cl.
USPC .......................................... 708/319; 708/316
(58) Field of Classification Search
USPC .................................................. 708/316, 319
See application file for complete search history.

(56) References Cited

U.S. PATENT DOCUMENTS

| 3,473,160 A | 10/1969 | Wahlstrom |
| 3,800,130 A | 3/1974 | Martinson et al. |
| 3,814,924 A | 6/1974 | Tate |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,616,330 A | 10/1986 | Betz |
| 4,623,961 A | 11/1986 | Mackiewicz |
| 4,682,302 A | 7/1987 | Williams |
| 4,718,057 A | 1/1988 | Venkitakrishnan et al. |

(Continued)

FOREIGN PATENT DOCUMENTS

| EP | 0 158 430 | 10/1985 |
| EP | 0 326 415 | 8/1989 |

(Continued)

OTHER PUBLICATIONS

Altera Corporation, "Advanced Synthesis Cookbook: A Design Guide for Stratix II, Stratix III and Stratix IV Devices," Document Version 3.0, 112 pgs., May 2008.

(Continued)

*Primary Examiner* — Tan V. Mai
(74) *Attorney, Agent, or Firm* — Ropes & Gray LLP; Jeffrey H. Ingerman (57) ABSTRACT

A specialized multiplier block in a programmable device incorporates multipliers and adders, and is configurable as one or more types of finite impulse response (FIR) filter including a Direct Form II FIR filter. The specialized multiplier block further includes input and output registers to allow chaining of Direct Form II FIR filters into longer Direct Form II FIR filters. An output accumulator also allows the specialized multiplier block to operate as a time-division multiplexed FIR filter, performing several filtering operations during each clock cycle of the programmable device.

40 Claims, 10 Drawing Sheets

(56) References Cited

U.S. PATENT DOCUMENTS

| | | |
|---|---|---|
| 4,727,508 A | 2/1988 | Williams |
| 4,736,335 A | 4/1988 | Barkan |
| 4,754,421 A | 6/1988 | Bosshart |
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |
| 4,918,637 A | 4/1990 | Morton |
| 4,967,160 A | 10/1990 | Quievy et al. |
| 4,982,354 A | 1/1991 | Takeuchi et al. |
| 4,991,010 A | 2/1991 | Hailey et al. |
| 4,994,997 A | 2/1991 | Martin et al. |
| 5,068,813 A | 11/1991 | Thoen |
| 5,073,863 A | 12/1991 | Zhang |
| 5,081,604 A | 1/1992 | Tanaka |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| RE34,363 E | 8/1993 | Freeman |
| 5,267,187 A | 11/1993 | Hsieh et al. |
| 5,296,759 A | 3/1994 | Sutherland et al. |
| 5,338,983 A | 8/1994 | Agarwala |
| 5,339,263 A | 8/1994 | White |
| 5,349,250 A | 9/1994 | New |
| 5,357,152 A | 10/1994 | Jennings, III et al. |
| 5,371,422 A | 12/1994 | Patel et al. |
| 5,375,079 A | 12/1994 | Uramoto et al. |
| 5,381,357 A | 1/1995 | Wedgwood et al. |
| 5,404,324 A | 4/1995 | Colon-Bonet |
| 5,416,799 A | 5/1995 | Currivan et al. |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,812 A | 3/1996 | Saishi et al. |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,541,864 A | 7/1996 | Van Bavel et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,623,377 A * | 4/1997 | Behrens et al. .................. 360/65 |
| 5,631,848 A | 5/1997 | Laczko. et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,519 A | 7/1997 | Yatim |
| 5,644,522 A | 7/1997 | Moyse et al. |
| 5,646,545 A | 7/1997 | Trimberger et al. |
| 5,646,875 A | 7/1997 | Taborn et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,771,186 A | 6/1998 | Kodali et al. |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,978 A | 12/1998 | Ogura et al. |
| 5,847,981 A | 12/1998 | Kelley et al. |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,935,197 A | 8/1999 | Aldworth |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |

(56) References Cited

U.S. PATENT DOCUMENTS

| | | |
|---|---|---|
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | De Lange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |
| 6,140,839 A | 10/2000 | Kaviani et al. |
| 6,144,980 A | 11/2000 | Oberman |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,260,053 B1 | 7/2001 | Maulik et al. |
| 6,279,021 B1 | 8/2001 | Takano et al. |
| 6,286,024 B1 | 9/2001 | Yano et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,327,605 B2 | 12/2001 | Arakawa et al. |
| 6,351,142 B1 | 2/2002 | Abbott |
| 6,353,843 B1 | 3/2002 | Chehrazi et al. |
| 6,359,468 B1 | 3/2002 | Park et al. |
| 6,360,240 B1 | 3/2002 | Takano et al. |
| 6,362,650 B1 | 3/2002 | New et al. |
| 6,366,944 B1 | 4/2002 | Hossain et al. |
| 6,367,003 B1 | 4/2002 | Davis |
| 6,369,610 B1 | 4/2002 | Cheung et al. |
| 6,377,970 B1 | 4/2002 | Abdallah et al. |
| 6,407,576 B1 | 6/2002 | Ngai et al. |
| 6,407,694 B1 | 6/2002 | Cox et al. |
| 6,427,157 B1 | 7/2002 | Webb |
| 6,434,587 B1 | 8/2002 | Liao et al. |
| 6,438,569 B1 | 8/2002 | Abbott |
| 6,438,570 B1 | 8/2002 | Miller |
| 6,446,107 B1 | 9/2002 | Knowles |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,487,575 B1 | 11/2002 | Oberman |
| 6,523,055 B1 | 2/2003 | Yu et al. |
| 6,523,057 B1 | 2/2003 | Savo et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,495 B1 | 7/2003 | Boland et al. |
| 6,600,788 B1 | 7/2003 | Dick et al. |
| 6,628,140 B2 | 9/2003 | Langhammer et al. |
| 6,687,722 B1 | 2/2004 | Larsson et al. |
| 6,692,534 B1 | 2/2004 | Wang et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,732,134 B1 | 5/2004 | Rosenberg et al. |
| 6,744,278 B1 | 6/2004 | Liu et al. |
| 6,745,254 B2 | 6/2004 | Boggs et al. |
| 6,763,367 B2 | 7/2004 | Kwon et al. |
| 6,771,094 B1 | 8/2004 | Langhammer et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,801,924 B1 | 10/2004 | Green et al. |
| 6,801,925 B2 | 10/2004 | Pether et al. |
| 6,806,733 B1 | 10/2004 | Pan et al. |
| 6,836,839 B2 | 12/2004 | Master et al. |
| 6,874,079 B2 | 3/2005 | Hogenauer |
| 6,889,238 B2 | 5/2005 | Johnson |
| 6,904,471 B2 | 6/2005 | Boggs et al. |
| 6,917,955 B1 | 7/2005 | Botchev |
| 6,924,663 B2 | 8/2005 | Masui et al. |
| 6,959,316 B2 | 10/2005 | Parviainen |
| 6,963,890 B2 | 11/2005 | Dutta et al. |
| 6,971,083 B1 | 11/2005 | Farrugia et al. |
| 6,978,287 B1 | 12/2005 | Langhammer |
| 6,983,300 B2 | 1/2006 | Ferroussat |
| 7,020,673 B2 | 3/2006 | Ozawa |
| 7,047,272 B2 | 5/2006 | Giacalone et al. |
| 7,062,526 B1 | 6/2006 | Hoyle |
| 7,093,204 B2 | 8/2006 | Oktem et al. |
| 7,107,305 B2 | 9/2006 | Deng et al. |
| 7,113,969 B1 | 9/2006 | Green et al. |
| 7,181,484 B2 | 2/2007 | Stribaek et al. |
| 7,313,585 B2 | 12/2007 | Winterrowd |
| 7,395,298 B2 | 7/2008 | Debes et al. |
| 7,401,109 B2 | 7/2008 | Koc et al. |
| 7,409,417 B2 | 8/2008 | Lou |
| 7,415,542 B2 | 8/2008 | Hennedy et al. |
| 7,421,465 B1 | 9/2008 | Rarick et al. |
| 7,428,565 B2 | 9/2008 | Fujimori |
| 7,428,566 B2 | 9/2008 | Siu et al. |
| 7,430,578 B2 | 9/2008 | Debes et al. |
| 7,430,656 B2 | 9/2008 | Sperber et al. |
| 7,447,310 B2 | 11/2008 | Koc et al. |
| 7,472,155 B2 | 12/2008 | Simkins et al. |
| 7,508,936 B2 | 3/2009 | Eberle et al. |
| 7,519,646 B2 | 4/2009 | Kaul et al. |
| 7,536,430 B2 | 5/2009 | Guevokian et al. |
| 7,567,997 B2 | 7/2009 | Simkins et al. |
| 7,587,443 B1 | 9/2009 | Langhammer |
| 7,590,676 B1 | 9/2009 | Langhammer |
| 7,646,430 B2 | 1/2010 | Brown Elliott et al. |
| 7,668,896 B2 | 2/2010 | Lutz et al. |
| 7,719,446 B2 | 5/2010 | Rosenthal et al. |
| 7,769,797 B2 | 8/2010 | Cho et al. |
| 7,930,335 B2 | 4/2011 | Gura et al. |
| 7,930,336 B2 | 4/2011 | Langhammer et al. |
| 2001/0023425 A1 | 9/2001 | Oberman et al. |
| 2001/0029515 A1 | 10/2001 | Mirsky |
| 2001/0037351 A1 | 11/2001 | Hellberg |
| 2001/0037352 A1 | 11/2001 | Hong |
| 2002/0002573 A1 | 1/2002 | Landers et al. |
| 2002/0038324 A1 | 3/2002 | Page et al. |
| 2002/0049798 A1 | 4/2002 | Wang et al. |
| 2002/0078114 A1 | 6/2002 | Wang et al. |
| 2002/0089348 A1 | 7/2002 | Langhammer |
| 2002/0116434 A1 | 8/2002 | Nancekievill |
| 2003/0088757 A1 | 5/2003 | Lindner et al. |
| 2004/0064770 A1 | 4/2004 | Xin |
| 2004/0078403 A1 | 4/2004 | Scheuermann et al. |
| 2004/0083412 A1 | 4/2004 | Corbin et al. |
| 2004/0122882 A1 | 6/2004 | Zakharov et al. |
| 2004/0148321 A1 | 7/2004 | Guevorkian et al. |
| 2004/0172439 A1 | 9/2004 | Lin |
| 2004/0178818 A1 | 9/2004 | Crotty et al. |
| 2004/0193981 A1 | 9/2004 | Clark et al. |
| 2004/0267857 A1 | 12/2004 | Abel et al. |
| 2004/0267863 A1 | 12/2004 | Bhushan et al. |
| 2005/0038842 A1 | 2/2005 | Stoye |
| 2005/0144212 A1 | 6/2005 | Simkins et al. |

(56) References Cited

U.S. PATENT DOCUMENTS

| | | | |
|---|---|---|---|
| 2005/0144215 | A1 | 6/2005 | Simkins et al. |
| 2005/0144216 | A1 | 6/2005 | Simkins et al. |
| 2005/0166038 | A1 | 7/2005 | Wang et al. |
| 2005/0187997 | A1 | 8/2005 | Zheng et al. |
| 2005/0187999 | A1 | 8/2005 | Zheng et al. |
| 2005/0262175 | A1 | 11/2005 | Iino et al. |
| 2006/0020655 | A1 | 1/2006 | Lin |
| 2007/0083585 | A1 | 4/2007 | St Denis et al. |
| 2007/0185951 | A1 | 8/2007 | Lee et al. |
| 2007/0185952 | A1 | 8/2007 | Langhammer et al. |
| 2007/0241773 | A1 | 10/2007 | Hutchings et al. |
| 2008/0133627 | A1 | 6/2008 | Langhammer et al. |
| 2008/0183783 | A1 | 7/2008 | Tubbs |
| 2009/0172052 | A1 | 7/2009 | DeLaquil et al. |
| 2009/0187615 | A1 | 7/2009 | Abe et al. |
| 2009/0300088 | A1 | 12/2009 | Michaels et al. |
| 2010/0098189 | A1 | 4/2010 | Oketani |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 049 025 | 11/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-068709 | 3/1992 |
| JP | 4-332036 | 11/1992 |
| JP | 5-134851 | 6/1993 |
| JP | 06-187129 | 7/1994 |
| JP | 7-135447 | 5/1995 |
| JP | 9-327000 | 12/1997 |
| JP | 11-296345 | 10/1999 |
| JP | 2000-259394 | 9/2000 |
| JP | 2002-108606 | 4/2002 |
| JP | 2002-251281 | 9/2002 |
| WO | WO95-27243 | 10/1995 |
| WO | WO96-28774 | 9/1996 |
| WO | WO97-08606 | 3/1997 |
| WO | WO98-12629 | 3/1998 |
| WO | WO98-32071 | 7/1998 |
| WO | WO98-38741 | 9/1998 |
| WO | WO99-22292 | 5/1999 |
| WO | WO99-31563 | 6/1999 |
| WO | WO99-56394 | 11/1999 |
| WO | WO00-51239 | 8/2000 |
| WO | WO00-52824 | 9/2000 |
| WO | WO01-13562 | 2/2001 |
| WO | WO 2005/066832 | 7/2005 |
| WO | WO2005-101190 | 10/2005 |
| WO | WO 2010/102007 | 9/2010 |

OTHER PUBLICATIONS deDinechin, F. et al., "Large multipliers with less DSP blocks," retrieved from http://hal-ens-lyon.archives-ouvertes.fr/ensl-00356421/en/, 9 pgs., available online Jan. 2009.

Wajih, E.-H.Y. et al., "Efficient Hardware Architecture of Recursive Karatsuba-Ofman Multiplier," $3^{rd}$ *International Conference on Design and Technology of Integrated Systems in Nanoscale Era*, 6 pgs, Mar. 2008.

Zhou, G. et al., "Efficient and High-Throughput Implementations of AES-GCM on FPGAs," *International Conference on Field-Programmable Technology*, 8 pgs., Dec. 2007.

Altera Corporation, "Stratix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Martinson, L. et al., "Digital Matched Filtering with Pipelined Floating Point Fast Fourier Transforms (FFT's)," *IEEE Transactions on Acoustics, Speech, and Signal Processing*, vol. ASSP-23, No.-2, pp. 222-34, Apr. 1975.

Haynes, S.D., et al., "Configurable multiplier blocks for embedding in FPGAs," *Electronics Letters*, vol. 34, No. 7, pp. 638-639 (Apr. 2, 1998).

Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.

Govindu, G. et al., "A Library of Parameterizable Floating-Point Cores for FPGAs and Their Application to Scientific Computing," *Proc Int'l Conf. Eng. Reconfigurable Systems and Algorithms (ERSA'05)* Jun. 2005.

Govindu, G. et al., "Analysis of High-performance Floating-point Arithmetic on FPGAs," *Proceedings of the $18^{th}$ International Parallel and Distributed Processing Symposium (PDPS'04)*, pp. 149-156, Apr. 2004.

Nakasato, N., et al., "Acceleration of Hydrosynamical Simulations using a FPGA board" *The Institute of Electronics Information and Communication Technical Report CPSY2005-47*, vol. 105, No. 515, Jan. 17, 2006.

Osana, Y., et al., "Hardware-resource Utilization Analysis on an FPGA-Based Biochemical Simulator ReCSiP", *The Institute of Electronics Information and Communication Technical Report CPSY2005-63*, vol. 105, No. 516, Jan. 18, 2006.

Vladimirova, T. et al., "Floating-Point Mathematical Co-Processor for a Single-Chip On-Board Computer," *MAPLD'03 Conference*, D5, Sep. 2003.

Altera Corporation, "Digital Signal Processing (DSP)," *Stratix Device Handbook*, vol. 2, Chapter 6 and Chapter 7, v1.1 (Sep. 2004).

Altera Corporation, "DSP Blocks in Stratix II and Stratix II GX Devices," *Stratix II Device Handbook*, vol. 2, Chapter 6, v4.0 (Oct. 2005).

Amos, D., "PLD architectures match DSP algorithms," *Electronic Product Design*, vol. 17, No. 7, Jul. 1996, pp. 30, 32.

Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 456-61.

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al. "Designing Power and Area Efficient Multistage FIR Decimators with Economical Low Order Filters," *ChipCenter Technical Note*, Dec. 2001.

Colet, P., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings—Vision, Image and Signal Processing*, vol. 147, No. 4, Aug. 2000, pp. 377-384.

(56) References Cited

OTHER PUBLICATIONS

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.

Gaffer, A.A., et al., "Floating-Point Bitwidth Analysis via Automatic Differentiation," *IEEE Conference on Field Programmable Technology*, Hong Kong, Dec. 2002.

Guccione, S.A.,"Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http:--.www.ee.washington.edu-people-faculty-hauck-publications-ReconfigFuture.PDF.

Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science* vol. 1896), Aug. 27-30, 2000, pp. 400-411.

Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.

Lattice Semiconductor Corp, *ORCA® FPGA Express™ Interface Manual: ispLEVER® Version 3.0*, 2002.

Lucent Technologies, Microelectronics Group,"Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings (IEEE Cat. No. 96TH8140)*, Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software-FPGA hardware partitions for a DSP application," *14th Australian Microelectronics Conference. Microelectronics: Technology Today for the Future. MICRO '97 Proceedings*, Sep. 28-Oct. 1, 1997, pp. 88-93.

Kramberger, I., "DSP acceleration using a reconfigurable FPGA," *ISIE '99. Proceedings of the IEEE International Symposium on Industrial Electronics* (Cat. No. 99TH8465), vol. 3 , Jul. 12-16, 1999, pp. 1522-1525.

Langhammer, M., "How to implement DSP in programmable logic," *Elettronica Oggi*, No. 266 , Dec. 1998, pp. 113-115.

Langhammer, M., "Implementing a DSP in Programmable Logic," *Online EE Times*, May 1998, http:--www.eetimes.com-editorial-1998-coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems (Digest)*, No. 233, 1998, pp. 2-1-2-4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9) vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-38.

Parhami, B., "Configurable arithmetic arrays with data-driven control," *34th Asilomar Conference on Signals, Systems and Computers*, vol. 1, 2000, pp. 89-93.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14 , Jul. 11, 2000, pp. 84-96.

Underwood, K. "FPGAs vs. CPUs: Trends in Peak Floating-Point Performance," *Proceedings of the 2004 ACM-SIGDA 12th International Symposium on Field Programmable Gate Arrays*, pp. 171-180, Feb. 22-24, 2004.

Valls, J., et al., "A Study About FPGA-Based Digital Filters," *Signal Processing Systems*, 1998 SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx* Apr. 2, 2001, module 2 of 4.

Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication," *MathWorld—A Wolfram Web Resource* (Dec. 9, 2007), accessed Dec. 11, 2007 at http:--mathworld.wolfram.com-KaratsubaMultiplication.html.

Wenzel, L., "Field programmable gate arrays (FPGAs) to replace digital signal processor integrated circuits," *Elektronik* , vol. 49, No. 5, Mar. 7, 2000, pp. 78-86.

Xilinx, Inc., "A 1D Systolic FIR," copyright 1994-2002, downloaded from http:--www.iro.umontreal.ca-~aboulham-F6221-Xilinx%20A%201D%20systolic%20FIR.htm.

Xilinx, Inc., "The Future of FPGA's," White Paper, available Nov. 14, 2005 for download from http:--www.xilinx.com-prs_rls,5yrwhite.htm.

Xilinx Inc., "XtremeDSP Design Considerations User Guide," v 1.2, Feb. 4, 2005.

Farooqui, A., et al., "General Data-Path Organization of a MAC unit for VLSI Implementation of DSP Processors," ISCAS '98, Part 2, May 31, 1998-Jun. 3, 1998, pp. 260-263.

Altera Corporation, "Implementing Multipliers in FLEX 10K EABs", Technical Brief 5, Mar. 1996.

(56) References Cited

OTHER PUBLICATIONS

Altera Corporation, "Implementing Logic with the Embedded Array in FLEX 10K Devices", Product Information Bulletin 21, ver. 2.1, May 2001, pp. 1-20.

Analog Devices, Inc., The Applications Engineering Staff of Analog Devices, DSP Division, *Digital Signal Processing Applications Using the ADSP-2100 Family* (edited by Amy Mar), 1990, pp. 141-192.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

QuickLogic Corporation, "The QuickDSP Design Guide", Rev. B, Aug. 2001, pp. 1-38.

QuickLogic Corporation, "The QuickDSP Family Data Sheer", Rev. B, Aug. 7, 2001, pp. 1-19.

Texas Instruments Inc., "TMS320C54x DSP Reference Set, vol. 1: CPU and Peripherals", Literature Number: SPRU131F, Apr. 1999, pp. 2-1 through 2-16 and 4-1 through 4-29.

Xilinx Inc., "Xilinx Unveils New FPGA Architecture to Enable High-Performance, 10 Million System Gate Designs", Xilinx Virtex-II Architecture Technology Backgrounder, Jun. 22, 2000, pp. 1-9.

Xilinx Inc., "Xilinx Announces DSP Algorithms, Tools and Features for Virtex-II Architecture", Nov. 21, 2000, pp. 1-4.

Xilinx Inc., "Virtex-II 1.5V Field-Programmable Gate Arrays", Advance Product Specification, DS031-2 (v1.3), Jan. 25, 2001, Module 2 of 4, pp. 1-50.

Xilinx Inc., "Virtex-II 1.5V Field-Programmable Gate Arrays", Advance Product Specification, DS031-1 (v1.5), Apr. 2, 2001, Module 1 of 4, pp. 1-7.

Xilinx Inc., "Virtex-II 1.5V Field-Programmable Gate Arrays", Advance Product Specification, DS031-2 (v1.5), Apr. 2, 2001, Module 2 of 4, pp. 1-36.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Altera Corporation, "FIR Compiler: MegaCore® Function User Guide," version 3.3.0, rev. 1, pp. 3 11 through 3 15 (Oct. 2005).

* cited by examiner

PROGRAMMABLE DEVICE WITH SPECIALIZED MULTIPLIER BLOCKS

CROSS REFERENCE TO RELATED APPLICATIONS

This is a continuation-in-part of copending, commonly-assigned U.S. patent application Ser. No. 12/547,664, filed Aug. 26, 2009, which is a continuation of commonly-assigned U.S. patent application Ser. No. 11/238,040, filed Sep. 27, 2005, now U.S. Pat. No. 7,590,676.

BACKGROUND OF THE INVENTION

This invention relates to programmable devices that include specialized multiplier blocks that can be configured as finite impulse response (FIR) filters, and more particularly to such programmable devices in which the specialized multiplier blocks may be interconnected to create larger filters, including multi-channel filters.

As programmable devices (such as, e.g., programmable logic devices, or PLDs) have become larger, it has become more common to add dedicated blocks to perform particular functions that have become more common in programmable devices. For example, at some point, such devices began to be provided with embedded blocks of random access memory that could be configured by the user to act as random access memory, read-only memory, or logic (such as sum-of-products logic, otherwise known as product term or P-TERM logic); such embedded blocks might even be provided in different sizes on the same device. Other types of memory, such as read-only memory (ROM) or shift registers, also have been provided. More recently, multiplier circuits have been provided on programmable devices. Whereas in prior programmable devices space was not available for dedicated multipliers, current larger devices can accommodate multipliers. This spares users from having to create multipliers by configuring the available logic. Moreover, as described in commonly-assigned U.S. Pat. No. 6,538,470, which is hereby incorporated by reference in its entirety, specialized multiplier blocks may be provided including multipliers and other arithmetic circuits such as adders and/or subtracters and/or accumulators. Such blocks are sometimes referred to as "multiplier-accumulator blocks" or "MAC blocks." Such blocks, for example, may be useful in digital signal processing, such as is performed in audio applications, and therefore such specialized multiplier blocks also are sometimes referred to as "DSP blocks."

One use for such specialized multiplier blocks is in filtering operations. In particular, one such specialized multiplier block described in commonly-assigned U.S. Pat. No. 6,556,044, can be configured as either a Direct Form I FIR filter or as a Direct Form II FIR filter. As seen there, in a Direct Form I FIR filter, several multiplier outputs are added using an adder chain, which also provides for chaining to the adder chain of another specialized multiplier block to create longer Direct Form I FIR filters. Indeed, a Direct Form I FIR filter of any length (up to the limit imposed by the number of specialized multiplier blocks on the programmable device) can be created.

On the other hand, as also seen there, a Direct Form II FIR filter uses an adder tree rather than an adder chain. Creating longer filters would require an adder tree outside the specialized multiplier blocks to add the results from plural specialized multiplier blocks. Because it is not known in advance how many blocks a user may want to add together, and because such adder trees consume large device areas, it is not practical to provide such adder trees on a programmable device. As a result, users who want to construct long Direct Form II FIR filters must use soft logic of the programmable device to construct the required adder tree. While this allows creation of an adder tree of any size, soft logic adders are slower, and consume a large amount of device resources.

It would be desirable to be able to provide a specialized multiplier block on a programmable device that allows large Direct Form II FIR filters to be constructed

SUMMARY OF THE INVENTION

The present invention achieves greater flexibility in the use of a specialized multiplier block of the type described above to create different types of FIR filters. A specialized multiplier block according to the invention preferably includes a registered output of the local adder tree which can be propagated to a registered input of a subsequent similar block. The registration lines up the output in time as between the two blocks and thereby allows such an arrangement to be used to form large FIR filters without an external adder tree. The size of the FIR filter is limited only by the number of available blocks.

In addition, by providing one such block with an accumulator at the output, the invention takes advantage of the ability of the adders and multipliers in the block to run faster than the system clock to provide a time-division multiplexed (TDM) FIR filter where multiple sets of data and coefficients are processed on each system clock cycle. Because the normal input register chain operates on the system clock, for this TDM FIR filter the inputs are taken from the soft logic regions of the programmable device.

By replacing appropriate registers in the input register chain, and elsewhere in the block, with respective shift registers of equal depth, a multi-channel FIR filter, where the number of channels is equal to the depth of the shift registers, can be created. Operating at the system clock rate, the sample rate of such a multi-channel filter would be the system clock rate divided by the number of channels. Alternatively, the sample rate could be maintained at the system clock rate if the filter can be overclocked by a factor equal to the number of channels, similar to the TDM embodiment above.

Therefore, in accordance with the present invention, there is provided a specialized multiplier block for use in a programmable device. The specialized multiplier block includes a plurality of multipliers having multiplier inputs and at least one input chain of shift registers of depth n. At least one input of each of the multipliers is connected to the input chain of shift registers. The specialized multiplier block also includes a plurality of adders, and programmable connections between the multipliers and the adders whereby said specialized multiplier block is configurable as an n-channel Direct Form II finite impulse response filter.

A programmable device incorporating the specialized multiplier block is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
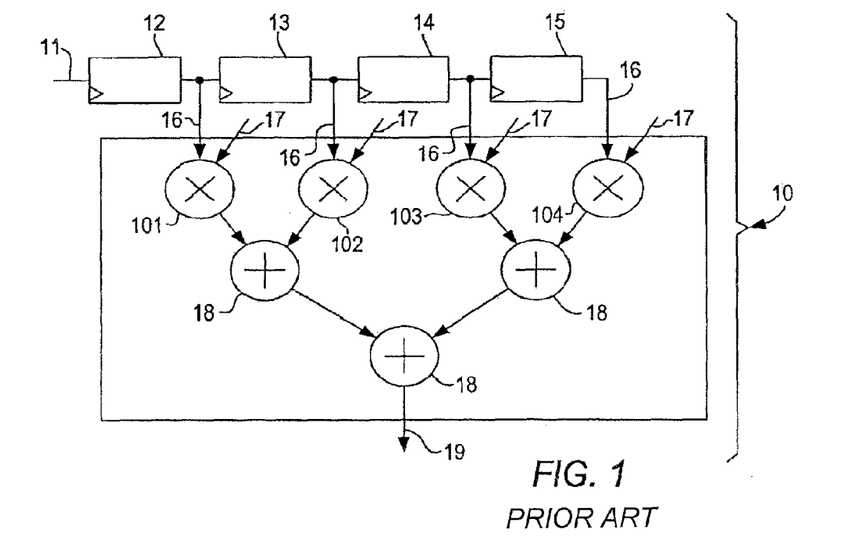
FIG. 1 is a schematic representation of a previously known specialized multiplier block configured as a Direct Form II FIR filter.

FIG. 1 shows a schematic representation of a previously known specialized multiplier block 10, of a type shown in commonly-assigned U.S. Pat. No. 6,556,044, which is hereby incorporated by reference herein in its entirety. In the representation shown in FIG. 1, specialized multiplier block 10 is configured as a Direct Form II finite impulse response (FIR) filter. Data is input at 11 to chain of input registers 12, 13, 14, 15, and one input 16 of each of multipliers 101, 102, 103, 104 is input from the register chain. The other inputs 17 of multipliers 101-104 represent the coefficients of the FIR filter, any may be stored or computed elsewhere, such as in the soft logic of a programmable device of which specialized multiplier block 10 is a part. A tree of adders 18 sum the outputs of multipliers 101-104 to provide the filter output 19.

Figure 2:
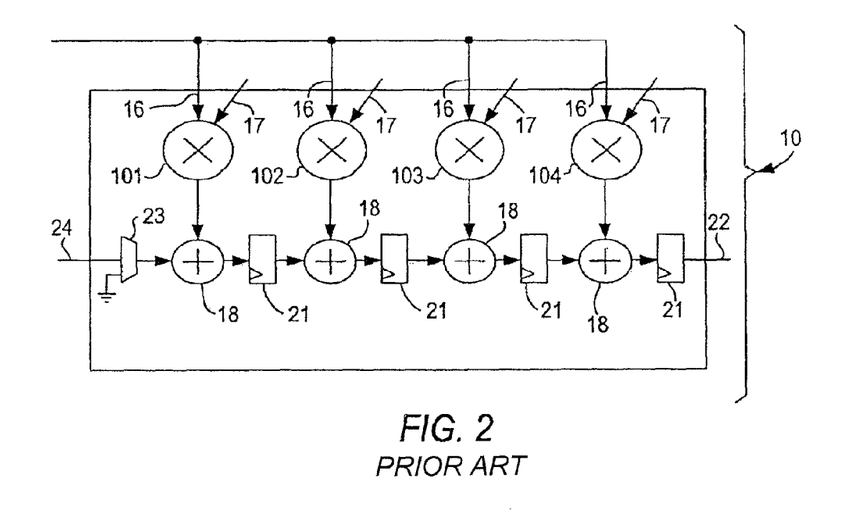
FIG. 2 is a schematic representation of a previously known specialized multiplier block configured as a Direct Form I FIR filter.

As an alternative, FIG. 2 shows a schematic representation of specialized multiplier block 10 configured as a Direct Form I finite impulse response (FIR) filter. Once again the coefficients are input at 17 to multipliers 101-104, while the data are input simultaneously at 16 to each multiplier 101-104, without registration. Instead of a tree of adders 18, a chain of adders 18, registered by registers 21, adds the multiplier outputs to form the filter output 22.

Specialized multiplier block 10 preferably contains a plurality of registers and programmable logic connectors (e.g., multiplexers) that allow for the different configurations shown as well as other configurations. The details of one embodiment of a suitable specialized multiplier block is shown in commonly-assigned U.S. Pat. No. 6,781,408, which is hereby incorporated by reference in its entirety.

Figure 3:
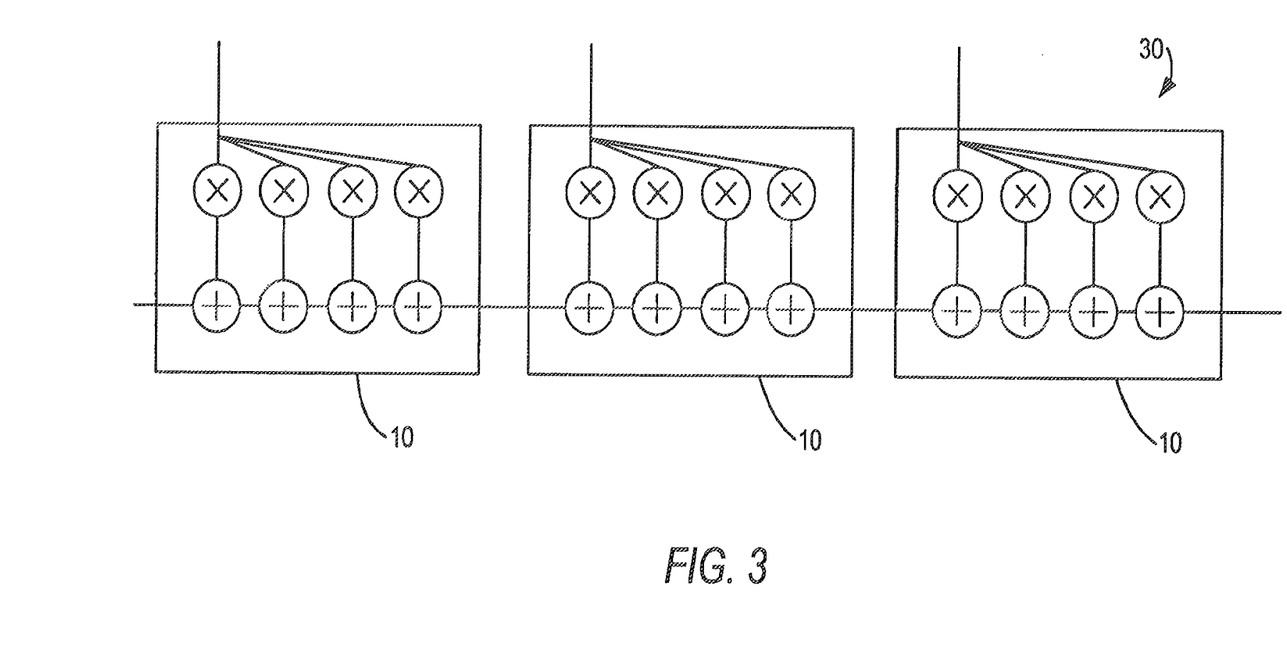
FIG. 3 is a schematic representation of a plurality of specialized multiplier blocks as in FIG. 2 chained to form a long Direct Form I FIR filter.

As seen in FIG. 3, several Direct Form I FIR filters of the type shown in FIG. 2 may easily be chained together to form a longer Direct Form I FIR filter. Multiplexer 23 accepts output 22 of a previous block 10 as input 24 to the adder chain. In that one of blocks 10 that is the first in the chain 30 of blocks 10, multiplexer 23 can select ground (i.e., zero) as the input to the adder chain.

Figure 4:
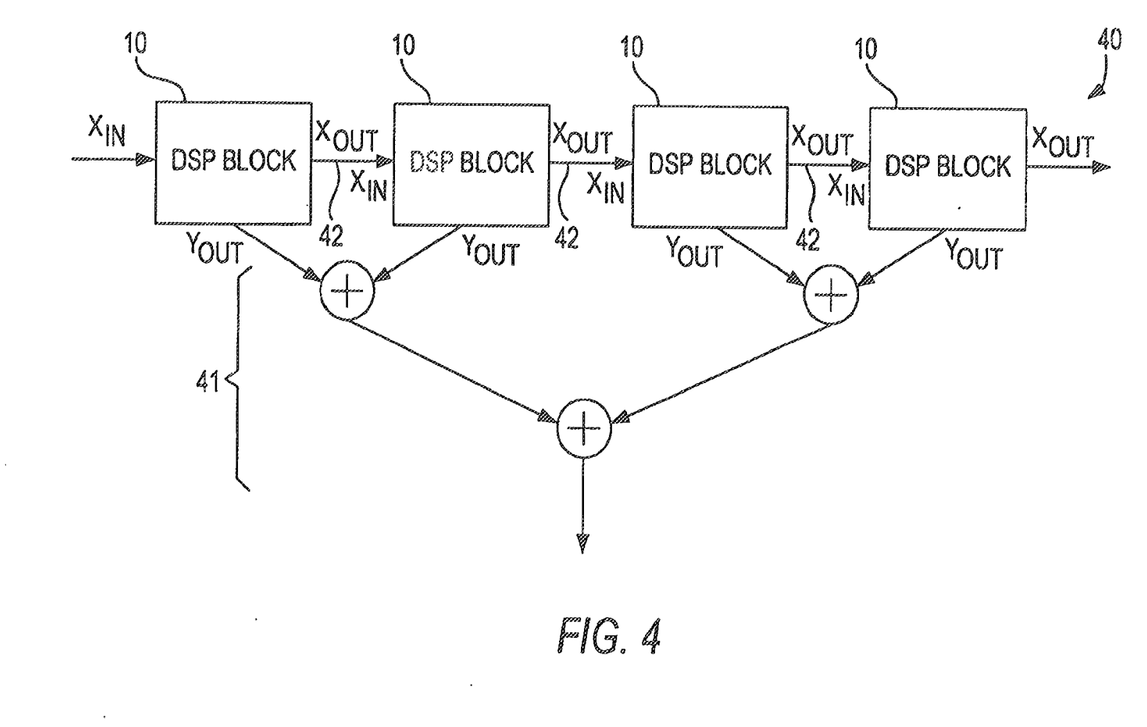
FIG. 4 is a schematic representation of a plurality of specialized multiplier blocks as in FIG. 1 arranged to form a long Direct Form II FIR filter.

Longer Direct Form II FIR filters may not be created so easily from blocks 10 as longer Direct Form I FIR filters. As seen in FIG. 4, in order to create a longer Direct Form II FIR filter 40, an external adder tree 41 is normally used to add the outputs of blocks 10, although the input register chains may be connected at 42. The creation of large adder chains in the soft logic of the programmable device consumes significant programmable device resources.

Figure 5:
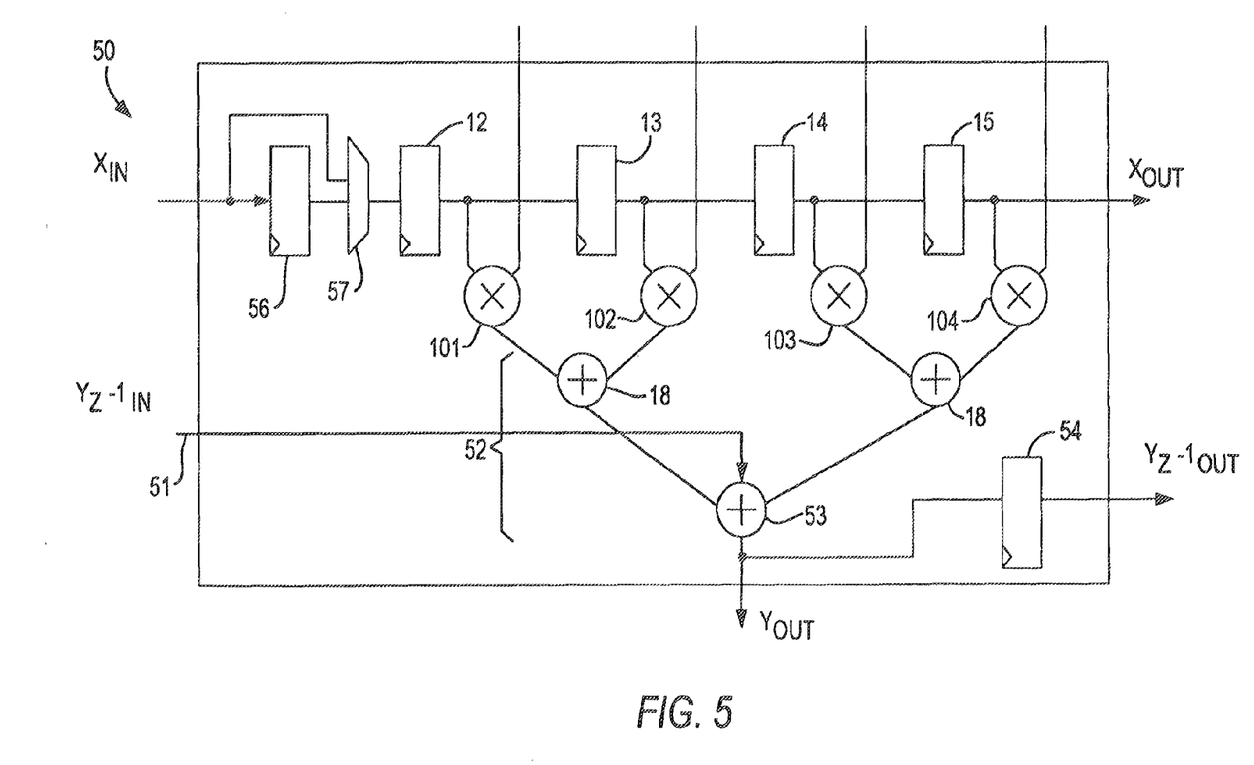
FIG. 5 is a schematic diagram of a preferred embodiment of a specialized multiplier block in accordance with an embodiment of the present invention.
Figure 6:
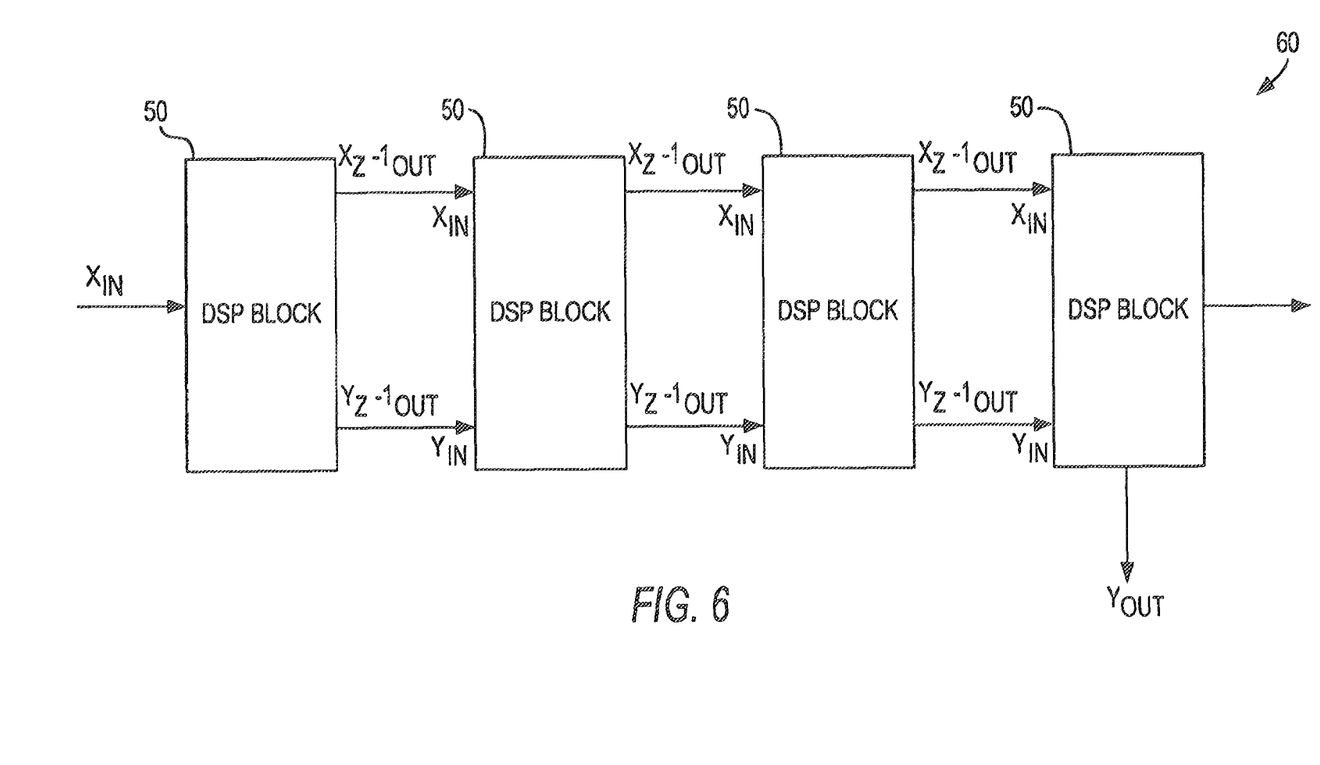
FIG. 6 shows how a plurality of the specialized multiplier blocks of FIG. 5 may be chained together as a long Direct Form II FIR filter.

Specialized multiplier block 50 according to the present invention, shown in FIG. 5, preferably allows the creation of longer Direct Form II FIR filters without an external adder tree, conserving programmable device resources. Block 50 preferably includes an additional input 51 from outside block 50 to final adder 53 of the block's internal adder tree 52. An output register 54 preferably is provided to register the output of adder 53. That output may be input to additional input 51 of adder 53 of another one of specialized multiplier block 50. If the output of specialized multiplier block 50 is thus registered and chained to the next block, the data samples in input registers 12-15 (FIG. 1), preferably should be delayed by the same amount so that the multiplier results line up with the incoming sum of multiplies from the previous specialized multiplier block. Therefore, specialized multiplier block 50 preferably also has a supplemental input register 56 on the input register chain 55, which may be selectably included, using multiplexer 57, in input register chain 55 when blocks 50 are being chained to form a long Direct Form II FIR filter. As seen in FIG. 6, a plurality of special multiplier blocks 50 can be chained to form a long Direct Form II FIR filter 60 in a manner similar to the way they may be chained to form a long Direct Form I FIR filter (cf., FIG. 3).

Figure 7:
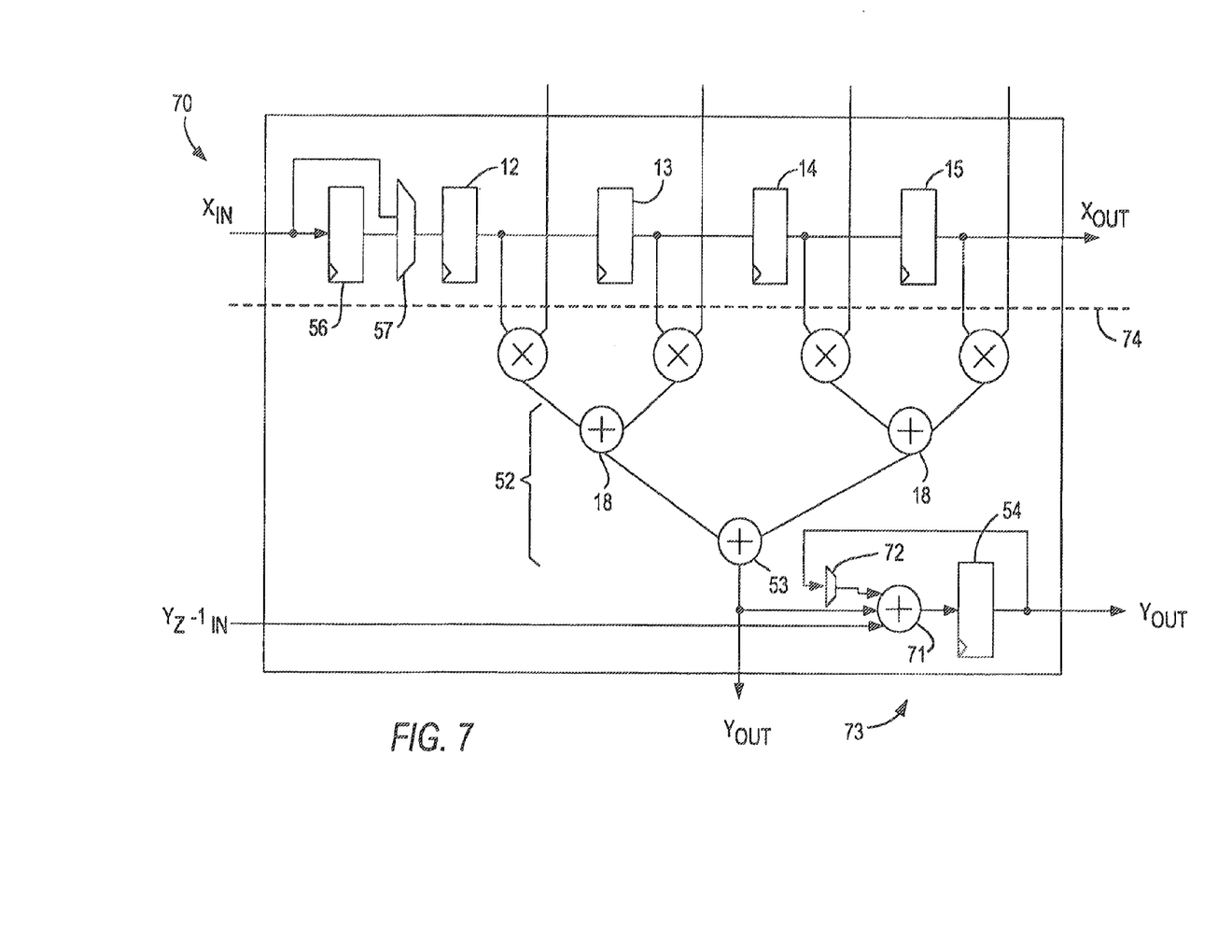
FIG. 7 is a schematic diagram of another preferred embodiment of a specialized multiplier block in accordance with the present invention.

A further embodiment of a specialized multiplier block 70 according to the invention is shown in FIG. 7, and takes advantage of the fact that the components of block 70 in some cases may be able to operate at clock speeds several times those of the programmable device of which block 70 is a part. Specialized multiplier block 70 includes a further adder 71 and multiplexer 72 that, in combination with output register 54, can be used to form an accumulator 73, which helps utilize this speed advantage to form a time-division multiplexed Direct Form II FIR filter that performs a plurality of filter cycles within one block 70 (and within one cycle of the programmable device clock), if a clock faster than the programmable device clock is provided. This could allow the formation of a long Direct Form II FIR filter without using more than one block 70.

Because input register chain 55 of block 70 is clocked by the programmable device clock, it operates, by definition, at the speed of that clock. Therefore, in a time-division multiplexed FIR filter implementation, the data as well as coefficients of the filter preferably come from outside block 70. Thus, the portion of block 70 above line 74 preferably is not used. As one example, the data may be input from a series of FIFO memories in the programmable device between the specialized multiplier blocks. Similarly, the faster clock needed to operate the time-division multiplexed filter, which preferably would be substantially a multiple of the programmable device clock, preferably is generated outside block 70, and either inside or outside the programmable device. Where, as here, specialized multiplier block 70 is used with registers external to block 70, supplemental input register 56 also may be implemented outside block 70.

Specialized multiplier blocks 50 and 70 preferably contain a plurality of registers and programmable logic connectors (e.g., multiplexers) that allow for the different configurations shown as well as other configurations. The details of one embodiment of a suitable specialized multiplier block, which can be implemented as either block 50 or block 70 is shown in commonly-assigned U.S. Pat. No. 7,230,451, which is hereby incorporated by reference herein in its entirety.

Figure 8:
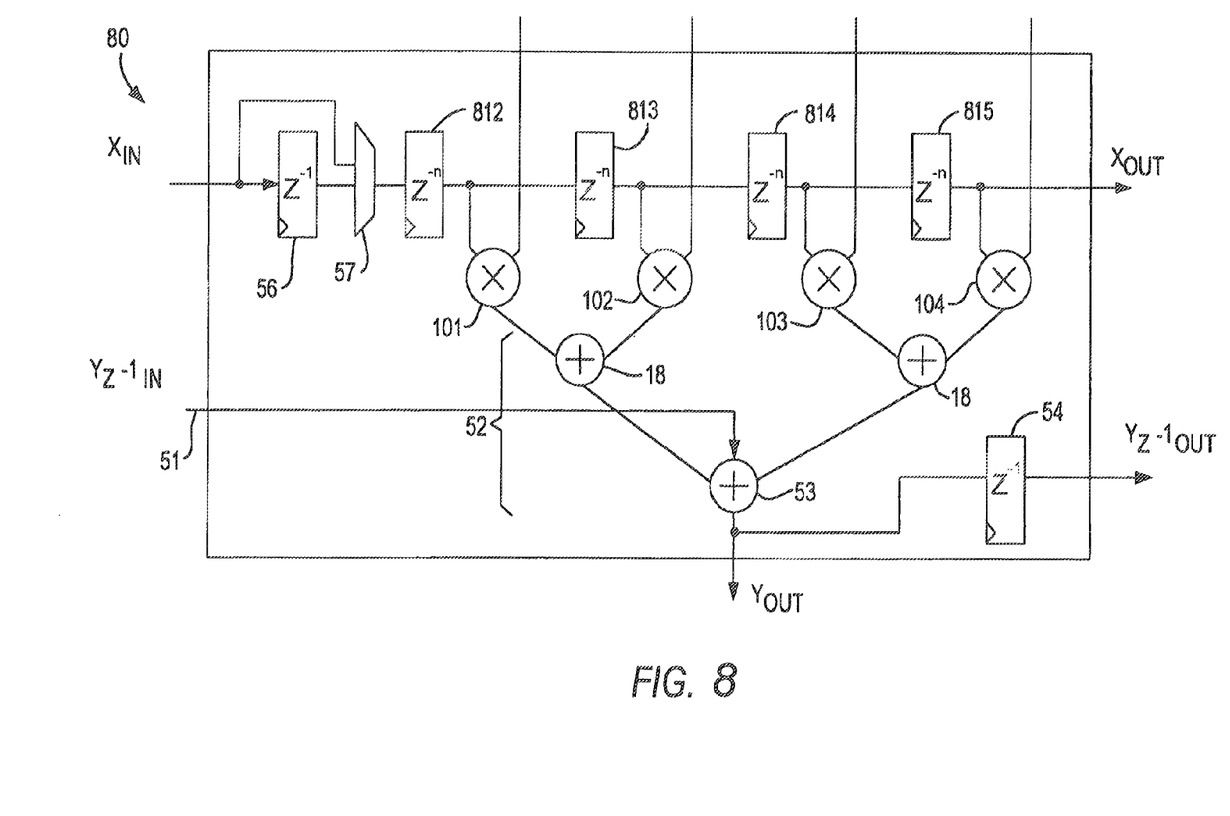
FIG. 8 is a schematic diagram of a multi-channel embodiment similar to the embodiment of FIG. 5.

Specialized multiplier block 80 of FIG. 8 is similar to specialized multiplier block 50 of FIG. 5, except that registers 12, 13, 14, 15 are replaced with shift registers 812, 813, 814, 815, each of depth n. This allows the formation of a multi-channel FIR filter capable of processing n channels. Without adjusting any clocks, specialized multiplier block 80 allows the formation of an re-channel FIR filter having a per-channel sample rate of one-nth of the system clock rate, with output register 54 registering the current output of the current channel. Because the re-channel filter is running at the system clock rate, providing one output sample at a time, supplemental input register 56 remains an ordinary register (or shift register of depth 1). Similarly, output register 54 (FIG. 5) remains an ordinary register.

Figure 9:
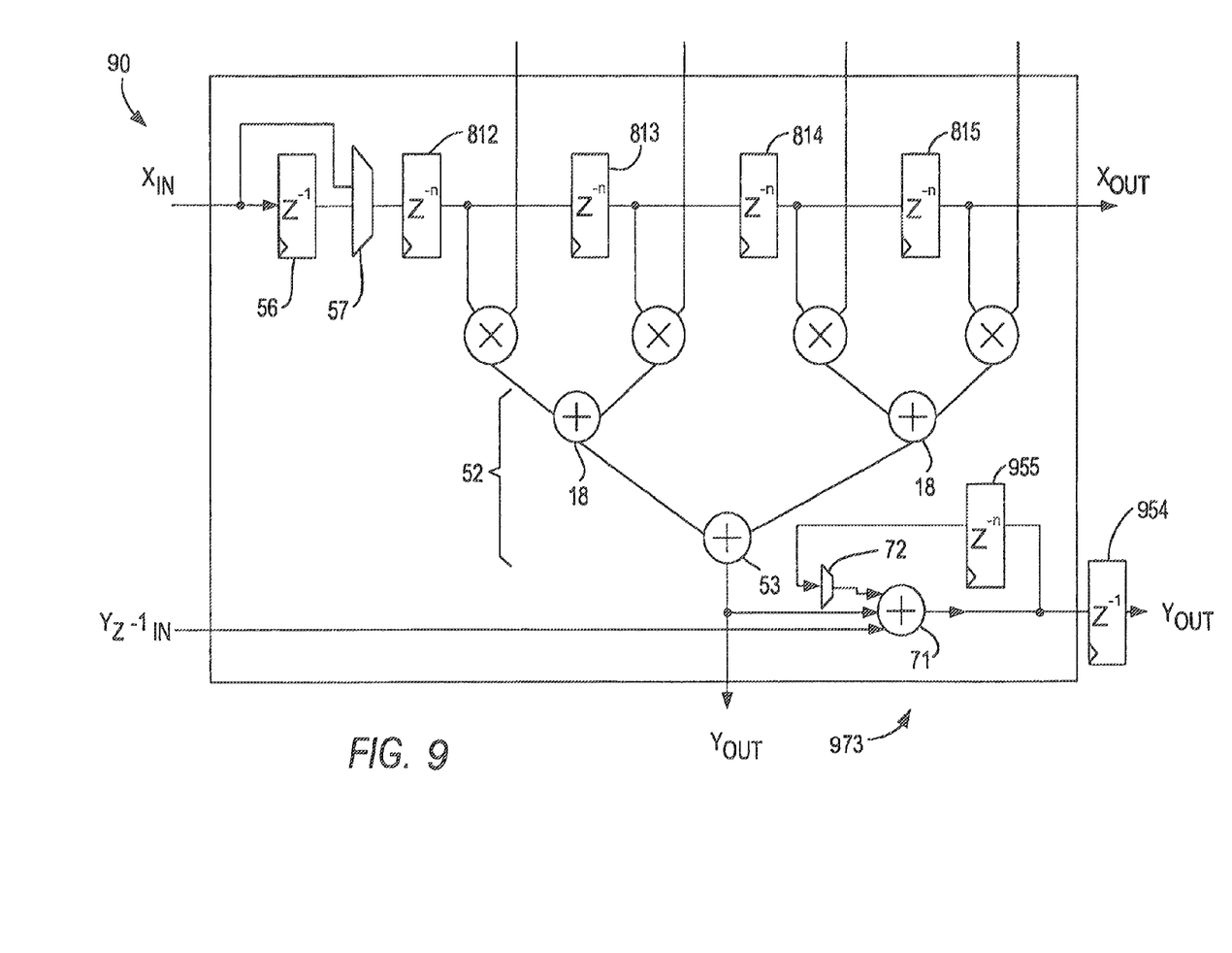
FIG. 9 is a schematic diagram of a first multi-channel embodiment similar to the embodiment of FIG. 7.

Alternatively, if specialized multiplier block 90 (FIG. 9) can be overclocked by a factor of n relative to the system clock, then a per-channel sample rate equal to the system clock may be maintained. In such a case, the operation of a multi-channel FIR filter based on specialized multiplier block 90 may be similar to the time-division multiplexed filter described above in connection with FIG. 7, except that the presence of shift registers 812, 813, 814, 815 eliminates the need to use input structures outside specialized multiplier block 90. In this case, a shift register 955 of depth n is needed to form accumulator 973 to keep up with all n channels. Output register 954 is moved outside the loop of accumulator 973 for implementations that do not include a multi-channel filter.

Figure 10:
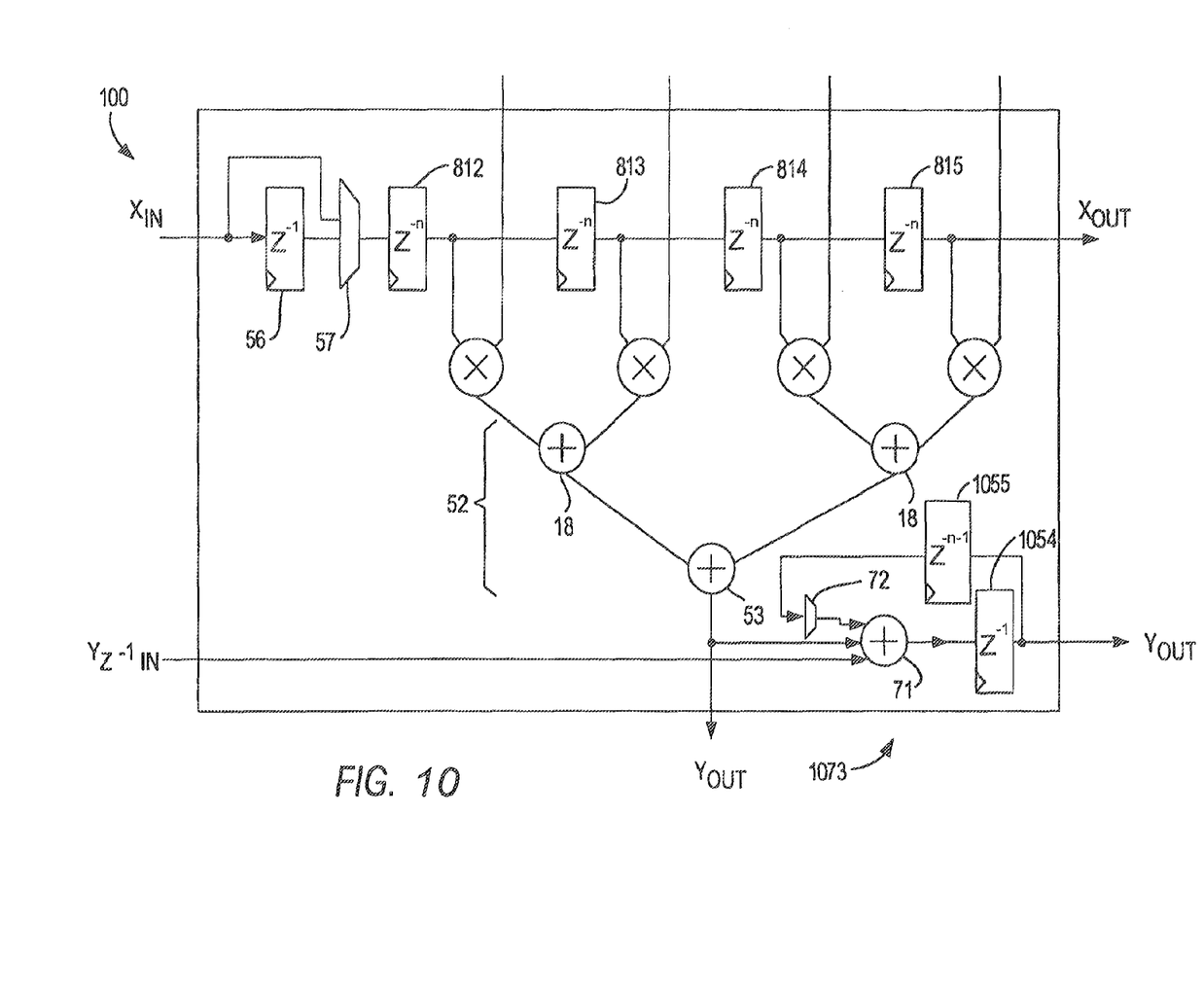
FIG. 10 is a schematic diagram of a first multi-channel embodiment similar to the embodiment of FIG. 7.

In a further alternative shown in FIG. 10, output register 1054 remains inside the loop of accumulator 1073 for implementations that do not include a multi-channel filter. Accordingly, for implementations that do include a multi-channel filter, a further shift register 1055 of depth n–1 rather than n is provided.

A programmable logic device ("PLD") 110 incorporating a specialized multiplier block according to the present invention may be used in many kinds of electronic devices. One possible use is in a data processing system 900 shown in FIG. 11. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

Figure 11:
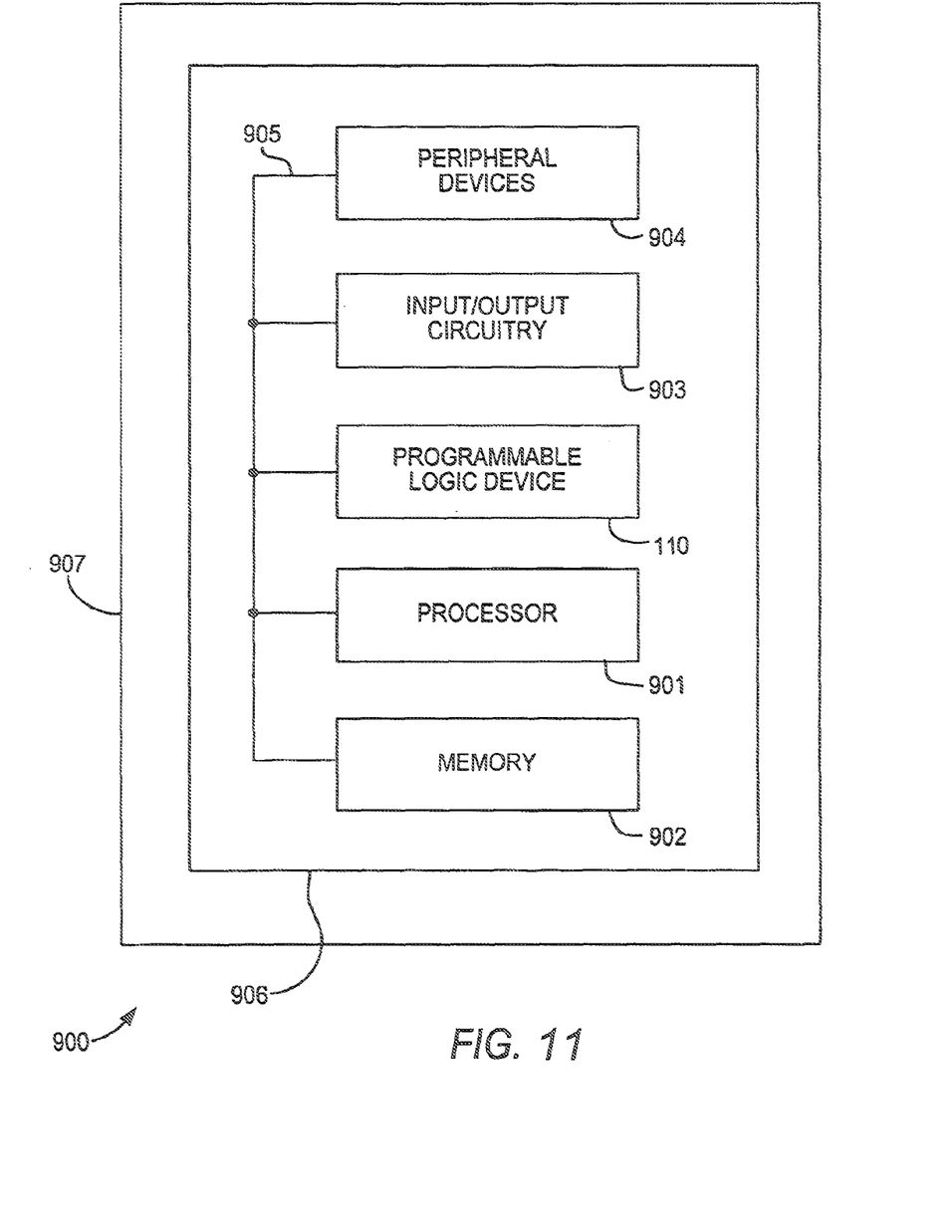
FIG. 11 is a schematic representation of a system including a programmable device incorporating the present invention.

System 900 can be used in a wide variety of applications, such as computer networking, data networking, instrumentation, video processing, digital signal processing, or any other application where the advantage of using programmable or reprogrammable logic is desirable. PLD 110 can be used to perform a variety of different logic functions. For example, PLD 110 can be configured as a processor or controller that works in cooperation with processor 901. PLD 110 may also be used as an arbiter for arbitrating access to a shared resources in system 900. In yet another example, PLD 110 can be configured as an interface between processor 901 and one of the other components in system 900. It should be noted that system 900 is only exemplary, and that the true scope and spirit of the invention should be indicated by the following claims.

Various technologies can be used to implement PLDs 80 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A specialized multiplier block for use in a programmable device, said specialized multiplier block comprising:
   a plurality of multipliers having multiplier inputs;
   at least one input chain of shift registers, each shift register in said chain of shift registers being of depth n, at least one input of each of said multipliers being connected to said input chain of shift registers;
   a plurality of adders; and
   programmable connections connecting outputs of said multipliers to inputs of said adders whereby said specialized multiplier block is configurable as an n-channel Direct Form II finite impulse response filter.

2. The specialized multiplier block of claim 1 further comprising:
   an output register for chaining output of said Direct Form II finite impulse response filter to another said specialized multiplier block; wherein:
   said specialized multiplier block is configurable with others of said specialized multiplier block as a long n-channel Direct Form II finite impulse response filter.

3. The specialized multiplier block of claim 2 further comprising a selectable output accumulator, said selectable output accumulator including:
   an adder having an adder input and an adder output;
   a selectable feedback loop from said adder output to said adder input; and
   a feedback shift register of depth n in said selectable feedback loop; wherein:
   said output register is beyond said selectable feedback loop.

4. The specialized multiplier block of claim 2 further comprising a selectable output accumulator, said selectable output accumulator including:
   an adder having an adder input and an adder output;
   a selectable feedback loop from said adder output to said adder input; and
   a feedback shift register of depth n–1 in said selectable feedback loop; wherein:
   said output register is within said selectable feedback loop.

5. A programmable device comprising the specialized multiplier block of claim 1.

6. A digital processing system comprising:
   processing circuitry;
   a memory coupled to said processing circuitry; and
   a programmable device as defined in claim 5 coupled to the processing circuitry and the memory.

7. A printed circuit board on which is mounted a programmable device as defined in claim 5.

8. The printed circuit board defined in claim 7 further comprising:
   memory circuitry mounted on the printed circuit board and coupled to the programmable device.

9. The printed circuit board defined in claim 8 further comprising:
   processing circuitry mounted on the printed circuit board and coupled to the memory circuitry.

10. An integrated circuit device comprising the specialized multiplier block of claim 1.

11. A digital processing system comprising:
    processing circuitry;
    a memory coupled to said processing circuitry; and
    an integrated circuit device as defined in claim 10 coupled to the processing circuitry and the memory.

12. A printed circuit board on which is mounted an integrated circuit device as defined in claim 10.

13. The printed circuit board defined in claim 12 further comprising:
memory circuitry mounted on the printed circuit board and coupled to the integrated circuit device.

14. The printed circuit board defined in claim 13 further comprising:
processing circuitry mounted on the printed circuit board and coupled to the memory circuitry.

15. A specialized multiplier block for use in a programmable device, said specialized multiplier block comprising:
a plurality of multipliers having multiplier inputs;
at least one input register chain, at least one input of each of said multipliers being connected to said input register chain;
a plurality of adders;
programmable connections connecting outputs of said multipliers to inputs of said adders whereby said specialized multiplier block is configurable as a Direct Form II finite impulse response filter; and
an output register for chaining output of said Direct Form II finite impulse response filter to another said specialized multiplier block; wherein:
said specialized multiplier block is configurable with others of said specialized multiplier block as a long Direct Form II finite impulse response filter.

16. The specialized multiplier block of claim 15 further comprising a selectably bypassable register at an input to said input register chain; wherein:
said output register is chainable to one said adder of another of said specialized multiplier block; and
said input register chain is chainable to said input register chain of said another of said specialized multiplier block via said selectably bypassable register of said another of said specialized multiplier block.

17. The specialized multiplier block of claim 15 further comprising a selectable output accumulator; whereby:
said specialized multiplier block is configurable as a time-division multiplexed Direct Form II finite impulse response filter.

18. The specialized multiplier block of claim 17 wherein said at least one input of each of said multipliers is selectably connectable to an input other than said input register chain.

19. The specialized multiplier block of claim 18 wherein said input other than said input register chain is programmable logic of said programmable device.

20. A programmable device comprising the specialized multiplier block of claim 15.

21. A digital processing system comprising:
processing circuitry;
a memory coupled to said processing circuitry; and
a programmable device as defined in claim 20 coupled to the processing circuitry and the memory.

22. A printed circuit board on which is mounted a programmable device as defined in claim 20.

23. The printed circuit board defined in claim 22 further comprising:
memory circuitry mounted on the printed circuit board and coupled to the programmable device.

24. The printed circuit board defined in claim 23 further comprising:
processing circuitry mounted on the printed circuit board and coupled to the memory circuitry.

25. An integrated circuit device comprising the specialized multiplier block of claim 15.

26. A digital processing system comprising:
processing circuitry;
a memory coupled to said processing circuitry; and
an integrated circuit device as defined in claim 25 coupled to the processing circuitry and the memory.

27. A printed circuit board on which is mounted an integrated circuit device as defined in claim 25.

28. The printed circuit board defined in claim 27 further comprising:
memory circuitry mounted on the printed circuit board and coupled to the integrated circuit device.

29. The printed circuit board defined in claim 28 further comprising:
processing circuitry mounted on the printed circuit board and coupled to the memory circuitry.

30. A specialized multiplier block for use in a programmable device, said specialized multiplier block comprising:
a plurality of multipliers having multiplier inputs;
at least one input register chain, at least one input of each of said multipliers being connected to said input register chain;
a plurality of adders;
programmable connections connecting outputs of said multipliers to inputs of said adders whereby said specialized multiplier block is configurable as a Direct Form II finite impulse response filter; and
an output accumulator selectably connectable to output of said adders; whereby:
said specialized multiplier block is configurable as a time-division multiplexed Direct Form II finite impulse response filter.

31. A programmable device comprising the specialized multiplier block of claim 30.

32. A digital processing system comprising:
processing circuitry;
a memory coupled to said processing circuitry; and
a programmable device as defined in claim 31 coupled to the processing circuitry and the memory.

33. A printed circuit board on which is mounted a programmable device as defined in claim 31.

34. The printed circuit board defined in claim 33 further comprising:
memory circuitry mounted on the printed circuit board and coupled to the programmable device.

35. The printed circuit board defined in claim 34 further comprising:
processing circuitry mounted on the printed circuit board and coupled to the memory circuitry.

36. An integrated circuit device comprising the specialized multiplier block of claim 30.

37. A digital processing system comprising:
processing circuitry;
a memory coupled to said processing circuitry; and
an integrated circuit device as defined in claim 36 coupled to the processing circuitry and the memory.

38. A printed circuit board on which is mounted an integrated circuit device as defined in claim 36.

39. The printed circuit board defined in claim 38 further comprising:
memory circuitry mounted on the printed circuit board and coupled to the integrated circuit device.

40. The printed circuit board defined in claim 39 further comprising:
processing circuitry mounted on the printed circuit board and coupled to the memory circuitry.

* * * * *